United States Patent

Kalb et al.

[15] 3,702,955

[45] Nov. 14, 1972

[54] MULTIPLE EMITTER TRANSISTOR APPARATUS

[72] Inventors: Jeffrey C. Kalb, San Jose; Robert J. Widlar, Mountain View, both of Calif.

[73] Assignee: National Semiconductor Corp., Santa Clara, Calif.

[22] Filed: July 11, 1969

[21] Appl. No.: 840,987

[52] U.S. Cl. .......317/235 R, 317/234 R, 317/235 D, 317/235 Y, 317/235 Z, 317/235 AE, 307/303

[51] Int. Cl. ..............................................H01l 19/00

[58] Field of Search...317/234, 235; 307/299, 299 A, 307/303

[56] References Cited

UNITED STATES PATENTS 3,233,125 2/1966 Buie ..........................307/88.5

3,283,170 11/1966 Buie.........................317/235 X

*Primary Examiner*—John W. Huckert
*Assistant Examiner*—B. Estrin
*Attorney*—Lowhurst & Hamrick

[57] ABSTRACT

A non-gold doped multiple emitter transistor device having an additional lateral PNP transistor formed in the collector region and a debiasing resistance formed in the base region, these elements cooperating to suppress the inherent PNP beta to substrate characteristic and control the inverse $H_{fe}$ of the device. The emitter of the additional transistor is connected to the base of the MET through a pinch-type debiasing resistor formed in a projection of the base region of the MET, and the base and collector of the additional transistor are shorted together and connected to the collector of the MET so as to provide a shunt path around the base-collector junction thereof.

3 Claims, 4 Drawing Figures

PATENTED NOV 14 1972

3,702,955

INVENTORS
JEFFREY C. KALB
ROBERT J. WIDLAR

BY Harvey J. [signature]

ATTORNEY

MULTIPLE EMITTER TRANSISTOR APPARATUS

BACKGROUND OF THE INVENTION

The present invention relates generally to multiple emitter transistors and, more particularly, to a novel method of construction of a multiple emitter transistor for use in TTL circuits.

In multiple emitter transistors (MET's), such as are described in the U.S. Pat. to Buie No. 3,283,170, the collector is direct coupled into the base of a controlled transistor so that when none of the emitters of the MET are selectively pulled lower than the collector potential, current is allowed to flow through the base-collector junction of the MET and into the base of the controlled transistor so as to maintain it in the conductive state. This current flow is that which produces a phenomenon known in the art as the inverse $H_{fe}$ of the MET device. In addition, because of the nature of the construction of the MET, an inherent PNP leakage path is also created between the base of the MET and the substrate in which it is formed so as to effectively shunt to ground a large portion of the current intended to provide the base drive for the controlled transistor before it is able to reach the controlled transistor. This structural characteristic gives rise to the phenomenon referred to in the art as PNP beta to substrate. This feature is generally considered undesirable and must be substantially reduced, in effect, where the MET is to be utilized in a TTL circuit, or the like, designed to handle high voltages.

Heretofore, gold doping has been utilized as a means for suppressing the current flow through the collector region (of the MET) and by positioning the collector terminal close to the base region effective discrimination against the PNP beta has been achieved. In addition to the gold doping, a debiasing resistance in the base circuit of the MET and a diode shunting this resistance and the base-collector junction are normally utilized to control the inverse $H_{fe}$. However, since gold doping reduces the life time of the injected carriers in the collector region and thus tends to reduce the beta of the device, it is highly desirable that a MET structure be provided which does not require that gold doping be utilized.

OBJECTS OF THE INVENTION

It is therefore a principal object of the present invention to provide a non-gold doped multiple emitter transistor for use in TTL circuits and the like, which has low inverse $H_{fe}$ as well as low PNP beta to substrate.

Another object of the present invention is to provide a novel non-gold doped multiple emitter transistor circuit which is better suited for utilization in TTL devices designed for high voltage applications.

Still another object of the present invention is to provide a novel non-gold doped multiple emitter transistor structure for high voltage applications utilizing additional integrated circuit elements as the means for providing against the PNP beta to substrate and inverse $H_{fe}$ problems inherently associated with structures of this type.

Still another object of the present invention is to provide a novel non-gold doped multiple emitter transistor device having an integrally formed debiasing resistance and an additional current shunting transistor element for providing a substantial reduction in the inherent beta to substrate while simultaneously providing adequate control of the inverse $H_{fe}$.

SUMMARY OF THE PRESENT INVENTION

In accordance with the present invention, an integrated circuit multiple emitter transistor device is provided having an additional lateral PNP transistor formed in the collector region and a debiasing resistance formed in the base region, these elements cooperating so as to suppress the inherent PNP beta to substrate characteristic and control the inverse $H_{fe}$ of the device. The emitter of the additional transistor is connected to the base of the MET through a debiasing resistor formed in a projection of the base region of the MET and the base and collector of the additional transistor are shorted together and connected to the collector of the MET so as to provide a shunt path around the base-collector junction thereof.

An important advantage of this novel structure is that gold doping need not be used to control the high inverse $H_{fe}$ and PNP beta to substrate characteristics of similar prior art structures, since these characteristics are substantially reduced by additional integrated circuit elements formed integral with the MET device.

Other advantages of the present invention will become apparent to those skilled in the art after having read the following detailed description of a preferred embodiment which is illustrated in the several figures of the drawing.

IN THE DRAWING

DETAILED DESCRIPTION OF THE PRESENT INVENTION

Figure 1:
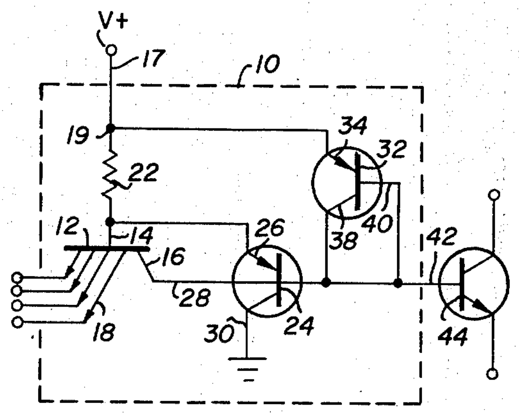
FIG. 1 is a schematic diagram of a multiple emitter transistor structure in accordance with the present invention.

Referring now to FIG. 1 of the drawing, there is shown at 10 a schematic diagram of a multiple emitter transistor (MET) circuit in accordance with the present invention. The circuit includes a multiple emitter NPN transistor 12 having a base 14, a collector 16 and a plurality of emitters 18. A terminal 19 is provided to which a suitable biasing source may be supplied. The base of the MET 12 is connected to terminal 17 through a debiasing resistance 22 which is formed in a portion of the base in a manner which will be described below. Because of the necessity of providing isolation for the transistor structure in the form of an isolation ring of P+ impurity, an inherent PNP element 24 is inadvertently created integral with the MET 12. This element 24 has its emitter 26 in common with the base 14 of the MET 12, its base 28 in common with the collector 16 of the MET 12, and its collector 30 coupled to the circuit ground. The actual physical interrelationship of these circuit elements will be explained below.

In addition to the MET 12 and the inherent PNP structure 24, an additional PNP structure 32 is intentionally included in the circuit having its emitter 34 coupled into the base circuit of the MET 12 at point 19 and its collector 38 and base 40 jointly connected to the collector 16 of the MET 12. The collector 16 of the MET device 10 is shown directly connected to the base 42 of an external transistor 44 to provide the base drive therefor.

In operation, the external transistor 44 is turned on by the application of the voltage $V^+$ to terminal 19 so long as none of the emitters 18 of the MET 12 are pulled low. Upon the initial application of the voltage $V^+$, current is caused to flow through the resistance 22 into the base 14 of the MET 12, out of the collector 16 thereof and thence into the base of the controlled transistor 44 causing it to become conductive. Under these conditions, the PNP element 24 also attempts to become conductive so as to provide a shunt path to ground for the current flowing into the MET 12. However, transistor 32 also becomes conductive to provide a shunt path around the resistance 22 and the MET 12 to the base 42 of transistor 44. Additionally, the placement of collector 38 of the PNP transistor 32 also reduces the PNP beta of PNP transistor 24 because of the field shaping which occurs in the base region of transistor 24.

The small amount of current which continues to flow through the resistance 22 produces a voltage drop thereacross which debiases the parasitic transistor 24 into its non-conductive state so that the leakage path to ground provided thereby is substantially eliminated. Thus, the PNP beta to ground problem which has heretofore perplexed the prior art is effectively controlled. In addition, since the current allowed to flow through the resistance 22 is maintained very low due to the substantial shunt produced thereacross by the transistor 32, the inverse $H_{fe}$ problem of the prior art is also effectively controlled.

By pulling any of the emitters 18 of the MET 12 to a lower potential than the collector 16, the MET 12 will become conductive and create a current path from collector 16 to the selected emitter 18 so as to rapidly drain the charge from the base 42 of the controlled transistor 44. This, of course, causes transistor 44 to be quickly turned OFF.

It will be noted that immediately following the selection of emitter 18, a current path will be provided from $V^+$ through transistor 32, which is still in its conductive state, and thence through the collector-emitter path of MET 12. This low impedance path permits an initial rush of current which rapidly drains the charge from the base 42 of transistor 44 so as to provide a quick turn off characteristic. It will also be noted that while the inverse $H_{fe}$ of MET 12 is controlled by the current flow characteristics produced by the combination of resistor 22 and transistor 32, these two elements also cooperate to maintain the PNP element 24 in a debiased state so that the beta to substrate problem is also controlled.

Figure 2:
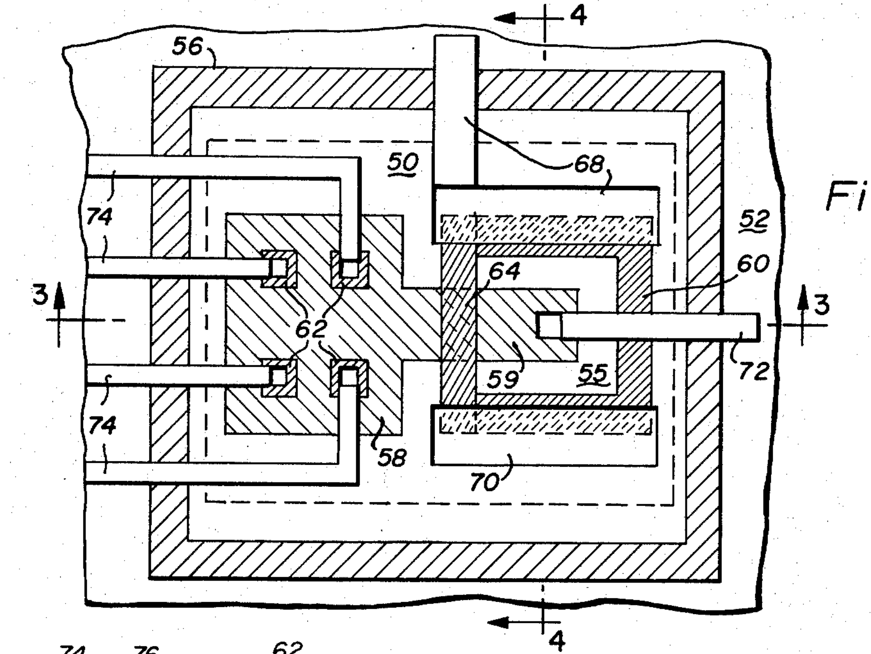
FIG. 2 is a plan view illustrating a preferred form of an MET constructed in accordance with the present invention.

Turning now to FIG. 2 of the drawing, an exemplary embodiment of the device schematically depicted in FIG. 1 is illustrated. The substrate material is initially prepared using the buried layer epitaxial process well-known in the prior art wherein a buried layer 50 of $n$-type impurity is provided in the $p$-type substrate 52 (see also FIG. 3). An $n$-film collector region 54 is epitaxially deposited and the surrounding $p^+$ isolation region 56 is then diffused thereinto surrounding the buried layer 50. The keyhole shaped $p$-type base region 58 and the U-shaped $p$-type region 60 are then diffused into the $n$-type region 54 as illustrated. The $n^+$ type regions 62 are then diffused into the $p$-type region 58 and the same diffusion is made into the elongated region 64 adjacent the ends of the $p$-type region 60 and across a portion of the $p$-type region 58.

Figure 3:
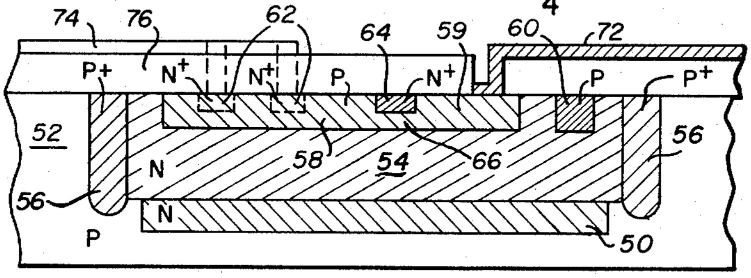
FIG. 3 is a cross section of the MET illustrated in FIG. 2 taken along the lines 3—3.

It can now be seen that the base 14, collector 16 and emitters 18 of the MET 12 shown in FIG. 1 are respectively provided by the $p$-type region 58, the $n$-film 50 and the $n^+$ regions 62; the base 28, emitter 26 and collector 30 of the parasitic PNP element 24 are respectively formed by the $n$-type region 54, the $p$-type region 58 and the $p$-type isolation ring 56; and the debiasing resistor 22 is formed by the diffusion of the $n+$ region 64 across the upper portion of the $p$-type region 58. This $n+$ region effectively reduces the cross section of the p-type region 58 therebeneath so as to form a pinch resistor at 66 (FIG. 3).

The resistance 22 results because the base current entering portion 59 of base region 58 is forced to flow through the substantially smaller cross section 66 of the lightly doped base region in order to reach the emitter diffused portion of region 58. The shunting transistor 32 illustrated in FIG. 1 and having emitter 34, collector 38 and base 40 is formed by the portion 59 of the base region 58, the $p$-type region 60 and the portion 55 of collector region 54, respectively.

Figure 4:
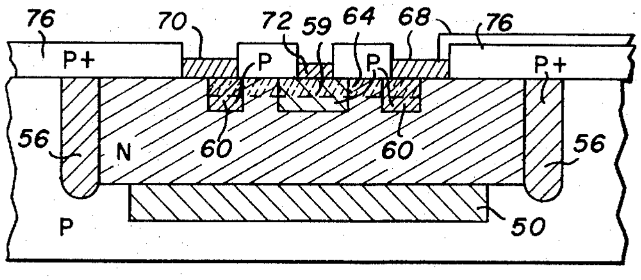
FIG. 4 is a cross section of the MET illustrated in FIG. 2 taken along the lines 4—4.

In order to provide the desired interconnection of the various transistor elements, metallic contacts 68 and 70 are positioned as shown and caused to ohmically contact the regions 60 and 64 shorting them together as partially illustrated in FIG. 4. Interconnect means 72 and 74 are also provided for contacting the base region 59 and the emitter regions 62. The ohmic contacts between the respective semiconductive regions and the interconnects are, of course, formed at apertures provided in the overlying oxide layer 76.

In accordance with the illustrated preferred embodiment of the invention, a non-gold doped MET may be provided having a controlled PNP beta to substrate of approximately 0.01 and an inverse $H_{fe}$ of about 0.001 to 0.003. Although the MET of the present invention is shown to be of the NPN type, it is to be understood that a similar technique could be used to provide a non-gold doped PNP MET.

After having read the above disclosure, it is contemplated that many alterations and modifications of the invention will become apparent to those of skill in the art. It is therefore to be understood that this description is of a preferred embodiment set forth for purposes of illustration only and is in no manner intended to be of a limiting nature. Accordingly, it is intended that the appended claims be interpreted as covering all modifications which fall within the true spirit and scope of the invention.

What is claimed is:

1. An integrated circuit transistor device, comprising:

a body of semiconductive material;

a first region of a first conductivity type formed in said body and terminating in a first surface of said body;

a second region of a second conductivity type formed in said body contiguous with and surrounding said first region and terminating in said first surface;

a third region of said second conductivity type formed in said first region and terminating in said first surface, said third region having a first portion and a second portion;

a fourth region of said first conductivity type formed in said first portion of said third region and terminating in said first surface;

a fifth region of said second conductivity type formed in said first region in spaced apart relationship with said second portion of said third region and terminating in said first surface;

a sixth region of said first conductivity type formed in said third region along a line defining said first and second portions, said sixth region extending into said first region on either side of said third region and terminating in said first surface, a first interconnect ohmically contacting said second portion of said third region;

a second interconnect ohmically contacting said fourth region; and a third interconnect ohmically contacting said first region, said fifth region and said sixth region.

2. An integrated circuit transistor device as recited in claim 1 wherein said sixth region substantially reduces the cross-sectional area of said third region lying therebeneath thereby providing an impedance to current flow between said first and second portions of said third region.

3. An integrated circuit transistor device as recited in claim 1 wherein said fifth region and said sixth region intersect to form a ring enclosing said second portion of said third region.

* * * * *